(12) United States Patent
Lin et al.

(10) Patent No.: US 6,417,064 B1
(45) Date of Patent: Jul. 9, 2002

(54) METHOD FOR TREATING THE SURFACE OF A DEEP TRENCH

(75) Inventors: Shian-Jyh Lin, Chiayi Hsien; Hai-Han Hung, Taoyuan, both of (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 09/846,302

(22) Filed: May 2, 2001

(30) Foreign Application Priority Data

Mar. 9, 2001 (TW) ........................... 90105571 A

(51) Int. Cl.$^7$ ............................................. H01L 21/20
(52) U.S. Cl. ..................... 438/386; 438/389; 257/296
(58) Field of Search .................. 438/386, 389; 257/296

(56) References Cited

U.S. PATENT DOCUMENTS 5,543,348 A  *  8/1996  Hammerl et al. ........... 438/386
5,753,558 A  *  5/1998  Akram et al. ............... 438/386

FOREIGN PATENT DOCUMENTS

| DE | 19956078 A1 | * | 5/2001 | ....... H01L/21/8242 |
| EP | 579566 A2 | * | 1/1994 | ......... H01L/27/108 |
| JP | 2000-243930 A | * | 8/2000 | ........... H01L/27/10 |

* cited by examiner

Primary Examiner—John F. Niebling
Assistant Examiner—David S Blum
(74) Attorney, Agent, or Firm—Birch, Stewart, Kolasch & Birch, LLP

(57) ABSTRACT

A method of treating the surface of a deep trench is disclosed. After forming a deep trench in a silicon substrate, the silicon substrate near the surfaces of the deep trench is treated to become amorphous. An annealing process is executed to make the amorphous silicon layer recrystallize into its original lattice arrangement, so as to reduce lattice defects in the surface of the deep trench.

18 Claims, 3 Drawing Sheets

METHOD FOR TREATING THE SURFACE OF A DEEP TRENCH

BACKGROUND OF THE INVENTION

1. Field of the Invention

The present invention relates in general to a method for treating the surface of a deep trench. More particularly, the present invention relates to a method for recovering the lattice of the silicon atoms in the surface of the deep trench.

2. Description of the Prior Art

DRAM is memory capable of reading and writing information. Each DRAM cell needs only one transistor and one capacitor, therefore it is easy to reach higher integration to make it broadly applicable to computers and electric equipment. A trench capacitor is one of the most commonly used capacitors, and is formed in the silicon semiconductor substrate. With the enhancement of the depth of the trench capacitor in the silicon semiconductor substrate, the surface area of the trench capacitor is increased, so that the capacitance is increased.

The traditional fabricating method of trench capacitors is described below. A trench is formed in a silicon semiconductor substrate. An As-doped silicon oxide layer is formed over the silicon semiconductor substrate with the trench. A photoresist is coated and removed by dry etching until the upper surface of the patterned photoresist is lower than that of the silicon semiconductor substrate by a predetermined distance. The exposed silicon oxide layer is removed using the remaining photoresist as a mask. Then, the doped ions, As, in the silicon oxide layer are driven into the silicon semiconductor substrate to form a conducting layer as a lower electrode of the trench capacitor.

With trends toward high capacitance and integration, the depth of the deep trench capacitor should be increased to gain more capacitance without sacrificing the integration. Therefore, the etching time should be increased, by which the structure of the crystal surface within the deep trench is damaged. Pits and dislocations are formed, creating a relatively rough surface. After undergoing subsequent thermal processes, these situations severely deteriorate, resulting in current leakages and damaging the effectiveness of the deep trench capacitor.

SUMMARY OF THE INVENTION

Therefore, the present invention provides a method for recovering the disordered lattice of silicon atoms in the surface of the deep trench.

Furthermore, the present invention provides a method for treating the surface of the deep trench, which can be applied to fabricate a deep trench capacitor with good electrical properties.

The present invention provides a method for treating the surface of a deep trench, comprising the following steps. After forming the deep trench in the single crystal silicon substrate, an amorphous treating process is executed to form an amorphous silicon layer on the surface of the deep trench. Then an annealing process is performed.

A method of fabricating a lower electrode of a deep trench capacitor comprises the following steps. After the deep trench is formed in the single crystal silicon substrate, an amorphous treating process is executed to form an amorphous silicon layer on the surface of the deep trench. A conformal silicon oxide layer doped with a conducting dopant is formed on the substrate. A photoresist layer is formed on the conformal silicon oxide layer. A part of the photoresist layer is removed to make the top surface of the photoresist layer lower than the top surface of the single crystal silicon substrate with a distance. Before the other part of the photoresist layer is removed, the exposed, conformal silicon oxide layer is removed. Then an thermal process is proceeded to drive the conducting dopant inside the conformal silicon oxide layer into the substrate, so as to form a lower electrode.

In accordance with the present invention, the amorphous treating process is an ion implantation process. The ion implanting angle $\theta$ in the ion implantation process depends on the depth (d) and width (w) of the deep trench, and is $(90°-\tan^{-1} d/w) \pm 0.50°$. The dopant used in the ion implantation process is selected from the group consisting of silicon, germanium, and inert gas. The inert gas is selected from the group consisting of nitrogen ($N_2$), neon (Ne), argon (Ar), krypton (Kr), xenon (Xe) and radon (Rn). The ion implanting energy used in the ion implantation process is about between 200 keV and 200 eV. The dosage used in the ion implantation process is between $1\times10^{14}$ and $1\times10^{17}$.

BRIEF DESCRIPTION OF THE DRAWINGS

The present invention will become more fully understood from the detailed description given herein below and the accompanying drawings, given by way of illustration only and thus not intended to be limitative of the present invention.

DETAILED DESCRIPTION OF THE INVENTION

During the etching of a deep trench in a single crystal silicon substrate, the lattice near the deep trench is disordered. This can affect the electrical properties of the elements formed in or near the deep trench. A method of regrowing the destroyed crystal structure is disclosed in the present invention and described hereafter. After the deep trench is formed in the single crystal silicon substrate by etching, the silicon near the deep trench is treated to an amorphous layer. An annealing process is executed to make the amorphous silicon recrystallize, thus recovering its original crystalline structure. This reduces the roughness and defects in the lattice.

The method used to treat silicon to become amorphous is an ion implantation process. The dopant used in the ion implantation process can be silicon (Si), germanium (Ge), or inert gas which comprises nitrogen ($N_2$), neon (Ne), argon (Ar), krypton (Kr), xenon (Xe) and redon (Rn). The ion implanting energy used to carry out the ion implantation process is about from 200 keV to 200 eV. The dosage used to perform the ion implantation process is about $1\times10^{14}$ to $1\times10^{17}$. Its ion implanting angle $\theta$ depends on the depth (d) and width (w) of the deep trench, and substantially equal to $(90°-\tan^{-1} d/w) \pm 0.5°$.

Embodiment

FIG. 1A to FIG. 1E show serial sectional-views of forming the deep trench capacitor by applying the treating method to the surfaces of the trench sidewalls.

Figure 1A:
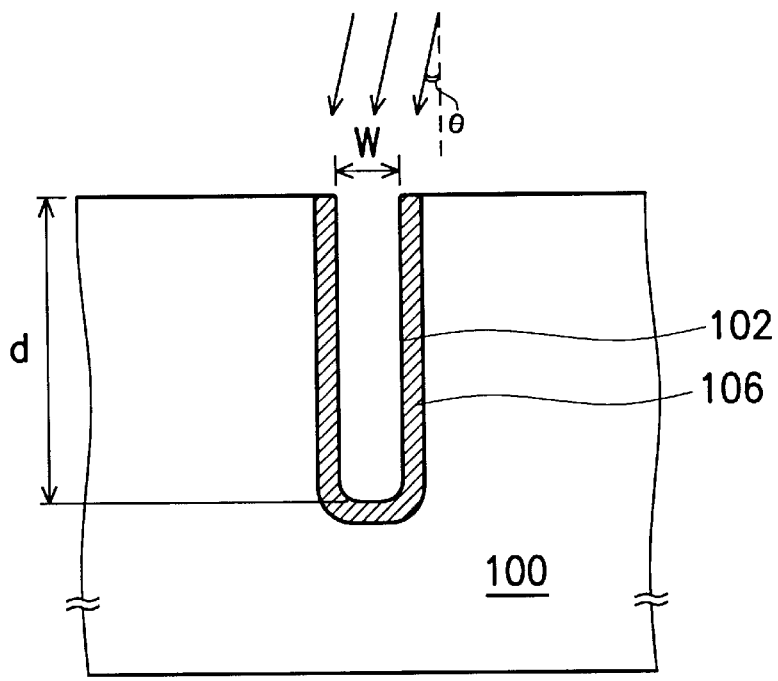
FIG. 1A to FIG. 1E show serial sectional-views of the to-be-formed and formed deep trench capacitor by applying the treating method to the surfaces of the sidewalls existing in the deep trench according to the embodiment of the present invention.

Referring to FIG. 1A, a substrate 100 is provided, such as a single crystal silicon substrate. A deep trench (shortened to trench hereafter) 102 is formed in the substrate 100 by, for example, etching. The trench 100 is ready to form a capacitor.

The sidewalls of the trench 102, included in the substrate 100, are treated to an amorphous layer 106. The method consists of an ion implantation process. The dopant used in this process can be silicon, germanium, or inert gas which comprises nitrogen, neon, argon, krypton, xenon and. redon. The ion implantation process is executed under the following conditions: the ion implanting energy is about 200 keV ~200 eV, the dosage is about $1\times10^{14}$ to $1\times10^{17}$, and the ion implanting angle θ is $(90°-\tan^{-1} d/w) \pm 0.5°$ which depends on the depth (d) and width (w) of the trench 102.

Figure 1B:
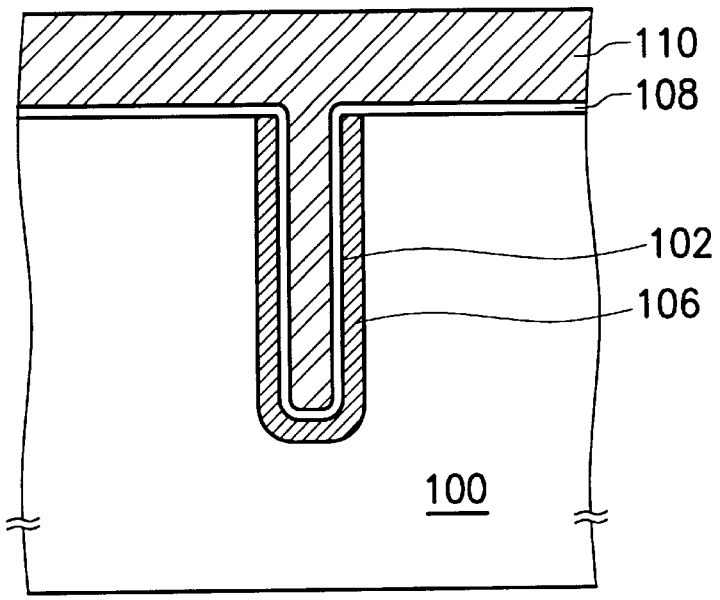
Figure 1C:
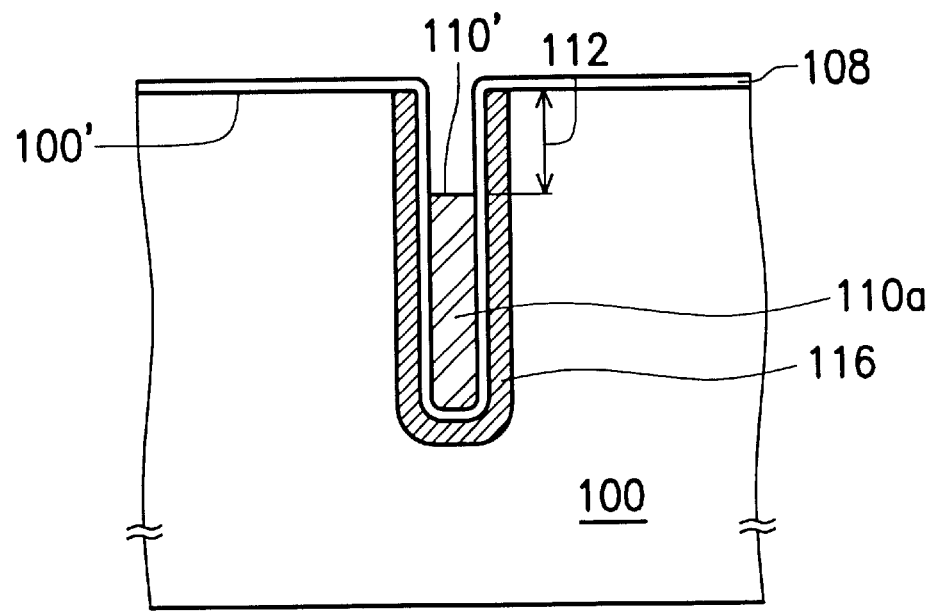
Figure 1D:
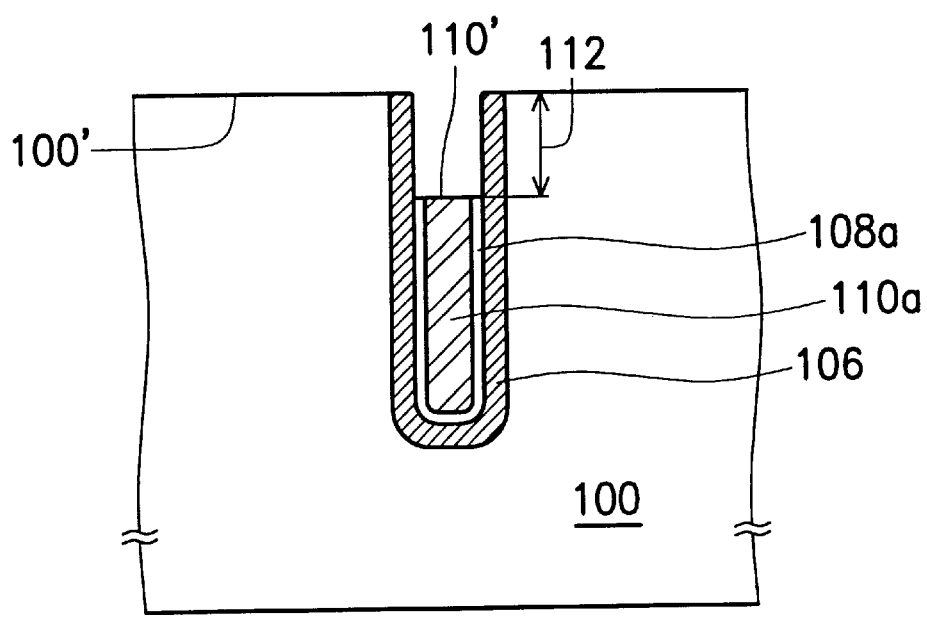

With reference to FIG. 1B, a conformal silicon oxide layer 108 is formed on the whole surface of the substrate 100, wherein the silicon oxide layer 108 includes a conducting dopant, such as the n-type dopant, phosphorus (P) and arsenic (As). A photoresist layer 110 is formed on the silicon oxide layer 108. Parts of the photoresist layer 110 are then removed until the top surface 110' of the converted photoresist layer 110a is lower than the top surface 100' of the substrate 100 by a predeterminded distance 112, as shown in FIG. 1C. Methods used to remove parts of the photoresist layer 110 to expose parts of the silicon oxide layer 108 can be wet or dry etching. The remaining photoresist layer 110a is employed as a mask, the exposed silicon oxide layer 108 is then removed, converting to a silicon oxide layer 108a as shown in FIG. 1D. The method used to remove the exposed silicon oxide layer 108 can be wet etching.

Figure 1E:
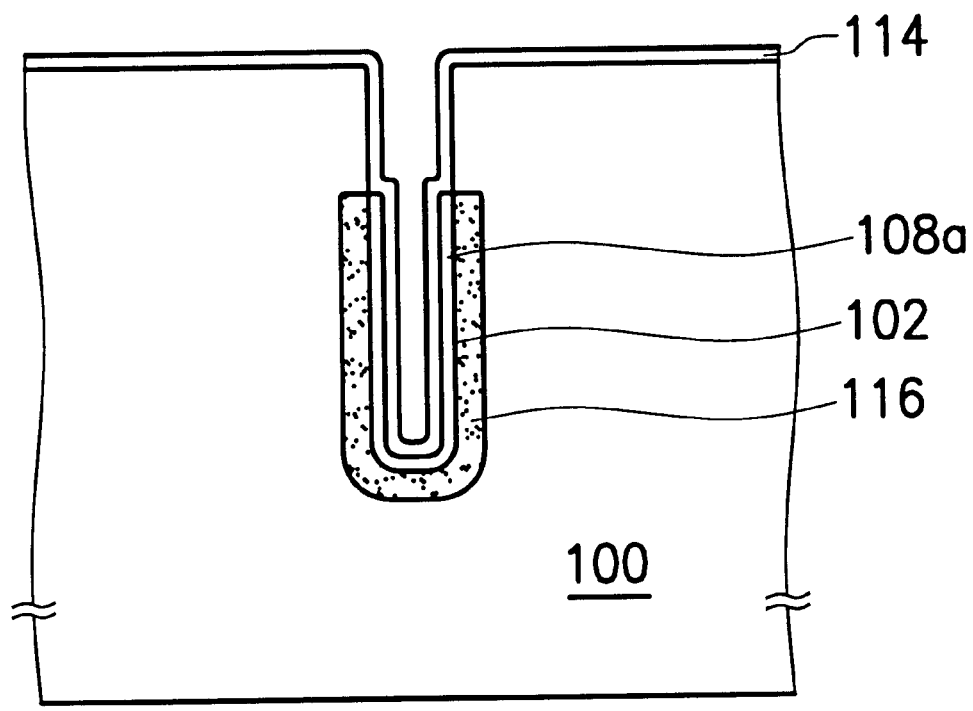

Turning to FIG. 1E, after removing the photoresist layer 110a, a dielectric layer 114, such as a silicon oxide layer using TEOS as a process gas, covers the whole wafer 100. A thermal process is performed to drive the conducting dopant in the silicon oxide layer 108a into the substrate 100, resulting in the formation of a buried plate (BP) in the substrate 100 around the trench 102. The resulting buried plate acts as a lower electrode 116 of the deep trench capacitor. The dielectric layer 114 functions to prevent the conducting dopant from diffusing into the chamber during the thermal process.

When the conducting dopant inside the silicon oxide layer 108a is driven into the substrate 100 in the thermal process, the amorphous silicon layer 106 around the trench 102 recrystallizes at the same time. Thus, the damaged crystal is restored epitaxially to re-form the original single-crystal structure. The rough surface and the defects of the lattice are repaired, and current leakage are reduced.

It should be noted that an annealing process can be alternatively executed after finishing the formation of the amorphous silicon layer 106. This can make the amorphous silicon layer 106 become crystalline earlier. The crystal structure can be reenhanced in the following thermal process used to drive the conducting dopant into the substrate 100. The probability of leakage occurring in the capacitor is further reduced.

According to the above-mentioned description, the present invention has at least the following advantages.

a. The method for treating the surface of the deep trench is conducted after the deep trench is formed in the substrate by etching, so that the damaged lattice can be recovered. Therefore, the elements formed in or near the deep trench have good electrical properties.

b. After the deep trench is formed in the substrate by etching, an ion implantation is used to treat the damaged substrate to become amorphous. The annealing process is employed to anneal out the damaged crystal. The amorphous silicon layer then regrows epitaxially to form the original lattice, reducing the rough surface and defects in the sidewalls of the deep trench.

c. The method for treating the surface of the deep trench disclosed by the present invention can be applied to fabricate the lower electrode of the deep trench capacitor to enhance the reliability of the capacitor.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for treating the surface of a deep trench, comprising:

providing a single crystal silicon substrate;

forming a deep trench in the single crystal silicon substrate, wherein the deep trench has a surface;

performing an amorphous treating process to form an amorphous silicon layer on the surface of the deep trench; and performing an annealing process.

2. The method as claimed in claim 1, wherein the amorphous treating process is an ion implantation process.

3. The method as claimed in claim 2, wherein an ion implanting angle θ in the ion implantation process is $(90°-\tan^{-1}d/w)\pm0.5°$, wherein d represents a depth of the deep trench, and w represents a width of that.

4. The method as claimed in claim 2, wherein a dopant used in the ion implantation process is selected from the group consisting of silicon, germanium, and inert gas.

5. The method as claimed in claim 4, wherein the inert gas is selected from the group consisting of nitrogen ($N_2$), neon (Ne), argon (Ar), krypton (Kr), xenon (Xe) and redon (Rn).

6. The method as claimed in claim 2, wherein an ion implanting energy used in the ion implantation process is between 200 keV and 200 eV.

7. The method as claimed in claim 2, wherein a dosage used in the ion implantation process is between $1\times10^{14}$ and $1\times10^{17}$.

8. A method of fabricating a lower electrode of a deep trench capacitor, comprising:

providing a single crystal silicon substrate;

forming a deep trench in the single crystal silicon substrate, wherein the deep trench has a surface;

performing an amorphous treating process to form an amorphous silicon layer on the surface of the deep trench;

forming a conformal silicon oxide layer doped with a conducting dopant on the single crystal silicon substrate;

forming a photoresist layer on the conformal silicon oxide layer;

removing a part of the photoresist layer to make the top surface of the photoresist layer lower than the top surface of the single crystal silicon substrate by a set distance, a part of the conformal silicon oxide layer being thus exposed;

removing the part of the exposed, conformal silicon oxide layer;

removing the photoresist layer; and performing an thermal process to drive the conducting dopant inside the conformal silicon oxide layer into the single crystal silicon substrate, so as to form a lower electrode.

9. The method as claimed in claim 8, wherein the amorphous treating process is an ion implantation process.

10. The method as claimed in claim 9, wherein an ion implanting angle θ in the ion implantation process is $(90°-\tan^{-1}d/w)\pm 0.5°$, wherein d represents a depth of the deep trench, and w represents a width of that.

11. The method as claimed in claim 9, wherein a dopant used in the ion implantation process is selected from the group consisting of silicon, germanium, and inert gas.

12. The method as claimed in claim 11, wherein the inert gas is selected from the group consisting of nitrogen ($N_2$), neon (Ne), argon (Ar), krypton (Kr), xenon (Xe) and radon (Rn).

13. The method as claimed in claim 9, wherein an ion implanting energy used in the ion implantation process is between 200 keV and 200 eV.

14. The method as claimed in claim 9, wherein a dosage used in the ion implantation process is between $1\times 10^{14}$ and $1\times 10^{17}$.

15. The method as claimed in claim 8, after finishing the amorphous treating process and before forming the conformal silicon oxide layer, further comprising performing an annealing process to make the amorphous silicon layer recrystallize as a single crystal silicon arrangement.

16. The method as claimed in claim 8, wherein the conducting dopant is arsenic (As).

17. The method as claimed in claim 8, wherein the conducting dopant is phosphorus (P).

18. The method as claimed in claim 8, before driving the conducting dopant into the single crystal silicon substrate, further comprising covering a dielectric layer on the conformal silicon oxide layer and the single crystal silicon substrate.

* * * * *